United States Patent
Bertin

(10) Patent No.: US 7,330,709 B2
(45) Date of Patent: Feb. 12, 2008

(54) RECEIVER CIRCUIT USING NANOTUBE-BASED SWITCHES AND LOGIC

(75) Inventor: Claude L. Bertin, Burlington, VT (US)

(73) Assignee: Nantero, Inc., Woburn, MA (US)

( * ) Notice: Subject to any disclaimer, the term of this patent is extended or adjusted under 35 U.S.C. 154(b) by 558 days.

(21) Appl. No.: 11/033,215

(22) Filed: Jan. 10, 2005

(65) Prior Publication Data
US 2005/0282516 A1    Dec. 22, 2005

Related U.S. Application Data

(60) Provisional application No. 60/581,075, filed on Jun. 18, 2004.

(51) Int. Cl.
*H04B 1/16* (2006.01)
*H03K 19/20* (2006.01)

(52) U.S. Cl. .............. 455/335; 455/254; 977/938; 977/940; 326/115; 326/125

(58) Field of Classification Search .......... 455/254, 455/334, 335; 977/938, 940; 326/115, 125
See application file for complete search history.

(56) References Cited

U.S. PATENT DOCUMENTS

| | | |
|---|---|---|
| 4,979,149 A | 12/1990 | Popovic et al. |
| 5,903,010 A | 5/1999 | Flory et al. |
| 6,128,214 A | 10/2000 | Kuekes et al. |
| 6,348,700 B1 | 2/2002 | Ellenbogen et al. |
| 6,445,006 B1 | 9/2002 | Brandes et al. |
| 6,518,156 B1 | 2/2003 | Chen et al. |
| 6,548,841 B2 | 4/2003 | Frazier et al. |
| 6,559,468 B1 | 5/2003 | Keuckes et al. |
| 6,574,130 B2 | 6/2003 | Segal et al. |
| 6,643,165 B2 | 11/2003 | Segal et al. |
| 6,673,424 B1 | 1/2004 | Lindsay et al. |
| 6,706,402 B2 | 3/2004 | Rueckes et al. |
| 6,750,471 B2 | 6/2004 | Bethune |

(Continued)

FOREIGN PATENT DOCUMENTS

WO    WO 01/03208 A1    1/2001

(Continued)

OTHER PUBLICATIONS

Ami, S. et al., "Logic gates and memory cells based on single $C_{60}$ electromechanical transistors," Nanotechnology, 2000, vol. 12, pp. 44-52.

(Continued)

*Primary Examiner*—Duc M. Nguyen
(74) *Attorney, Agent, or Firm*—Wilmer Cutler Pickering Hale and Dorr LLP

(57) ABSTRACT

Receiver circuits using nanotube based switches and logic. Preferably, the circuits are dual-rail (differential). A receiver circuit includes a differential input having a first and second input link, and a differential output having a first and second output link. First, second, third and fourth switching elements each have an input node, an output node, a nanotube channel element, and a control structure disposed in relation to the nanotube channel element to controllably form and unform an electrically conductive channel between said input node and said output node. The receiver circuit can sense small voltage inputs and convert them to larger voltage swings.

6 Claims, 6 Drawing Sheets

U.S. PATENT DOCUMENTS

| | | | |
|---|---|---|---|
| 6,760,245 | B2 | 7/2004 | Eaton, Jr. et al. |
| 6,781,166 | B2 | 8/2004 | Lieber et al. |
| 6,784,028 | B2 | 8/2004 | Rueckes et al. |
| 6,803,840 | B2 | 10/2004 | Hunt et al. |
| 6,809,465 | B2 | 10/2004 | Jin |
| 6,835,591 | B2 | 12/2004 | Rueckes et al. |
| 6,864,162 | B2* | 3/2005 | Jin ............................ 438/551 |
| 7,161,403 | B2* | 1/2007 | Bertin ....................... 327/202 |
| 7,164,744 | B2* | 1/2007 | Bertin ........................ 326/30 |
| 2001/0023986 | A1 | 9/2001 | Mancevski |
| 2002/0130353 | A1 | 9/2002 | Lieber et al. |
| 2002/0175390 | A1 | 11/2002 | Goldstein et al. |
| 2003/0021966 | A1 | 1/2003 | Segal et al. |
| 2003/0124325 | A1 | 7/2003 | Rueckes et al. |
| 2004/0043527 | A1* | 3/2004 | Bradley et al. ............... 438/48 |
| 2004/0067602 | A1* | 4/2004 | Jin ............................. 438/22 |
| 2004/0175856 | A1 | 9/2004 | Jaiprakash et al. |
| 2004/0181630 | A1 | 9/2004 | Jaiprakash et al. |
| 2005/0035344 | A1 | 2/2005 | Bertin et al. |
| 2005/0035367 | A1 | 2/2005 | Bertin et al. |
| 2005/0035786 | A1 | 2/2005 | Bertin et al. |
| 2005/0035787 | A1 | 2/2005 | Bertin et al. |
| 2005/0036365 | A1 | 2/2005 | Bertin et al. |
| 2005/0037547 | A1 | 2/2005 | Bertin et al. |
| 2005/0282515 | A1* | 12/2005 | Bertin ....................... 455/335 |
| 2007/0114517 | A1* | 5/2007 | Byrn .......................... 257/40 |

FOREIGN PATENT DOCUMENTS

| | | |
|---|---|---|
| WO | WO 01/44796 A1 | 6/2001 |
| WO | WO 03/091486 A1 | 11/2003 |
| WO | WO 2004/065655 A1 | 8/2004 |
| WO | WO 2004/065657 A1 | 8/2004 |
| WO | WO 2004/065671 A1 | 8/2004 |

OTHER PUBLICATIONS

Avouris, P. et al., "Carbon Nanotube Electronics," Chemical Physics, 2001, vol. 281, pp. 429-445.

Bachtold, A. et al., "Logic Circuits with Carbon Nanotube Transistors," Science, 2001, vol. 294, pp. 1317-1320.

Bachtold, A. et al., "Logic Circuits Based on Carbon Nanotubes," Physica E, 2003, vol. 16, pp. 42-46.

Collier, C.P. et al., "Electronically Configurable Molecular-Based Logic Gates," SCIENCE 1999, vol. 285, pp. 391-394.

Dehon, A., "Array-Based Architecture for FET-Based, Nanoscale Electronics", IEEE Transactions on Nanotechnology, 2003, vol. 2(1), pp. 23-32.

Dequesnes, M et al., "Simulation of carbon nanotube-based nanoelectromechanical switches," Computational Nanoscience and Nanotechnology, 2002, pp. 383-386.

Dequesnes, M. et al., "Calculation of pull-in voltages for carbon-nanotube-based nanoelectromechanical switches," Nanotechnology, 2002, vol. 13, pp. 120-131.

Derycke, V. et al., "Carbon Nanotube Inter- and Intramolecular Logic Gates," Nano Letters, 2001, vol. 1(9), pp. 453-456.

Franklin, N.R. et al., "Integration of suspended carbon nanotube arrays into electronic devices and electromechanical systems," Appl. Phys. Lett.,2002, vol. 81(5), pp. 915-915.

Fuhrer, M.S. et al., "High-Mobility Nanotube Transistor Memory," Nano Letters, 2002, vol. 2(7), pp. 755-759.

Hoenlein, W. et al., "Carbon nanotubes for microelectronics: status and future prospects," Materials Science and Engineering, 2003, vol. 23, pp. 663-669.

Huang, Y. et al., "Logic Gates and Computation from Assembled Nanowire Building Blocks," Science, 2001, vol. 294, pp. 1313-1316.

Javey, A. et al., "Carbon Nanotube Transistor Arrays for Multistage Complementary Logic and Ring Oscillators," Nano Letters, 2002, vol. 2(9), pp. 929-932.

Kinaret, J.M. et al., "A carbon-nanotube-based nanorelay," Applied Physics Letters, 2003, vol. 82(8), pp. 1287-1289.

Lin, Y.-M. et al., "Ambipolar-to-Unipolar Conversion of Carbon Nanotube Transistors by Gate Structure Engineering," Nano Lett. 2004, vol. 4(5), pp. 947-950.

Martel, R. et al., "Carbon Nanotube Field-Effect Transistors and Logic Circuits," DAC, 2002, vol. 7.4, pp. 94-98.

Rueckes, T. et al., "Carbon Nanotube-Based Nonvolatile Random Access Memory for Molecular Computing," Science, 2000. vol. 289, pp. 94-97.

Tans, S.J. et al., "Room-temperature transistor based on a single carbon nanotube," Nature, 1998, vol. 393, pp. 49-52.

Zhan, W. et al., "Microelectrochemical Logic Circuits," J. Am. Chem. Soc., 2003, vol. 125, pp. 9934-9935.

United States Patent and Trademark Office, International Search Report for PCT/US2005/18536 mailed Oct. 2, 2006, 3 pages.

* cited by examiner

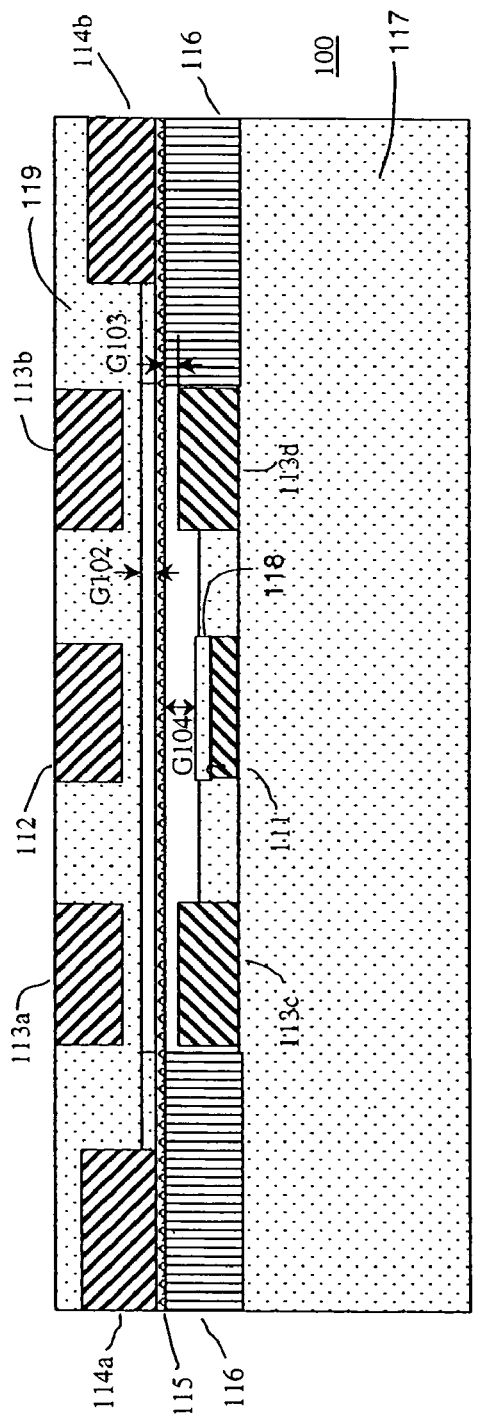
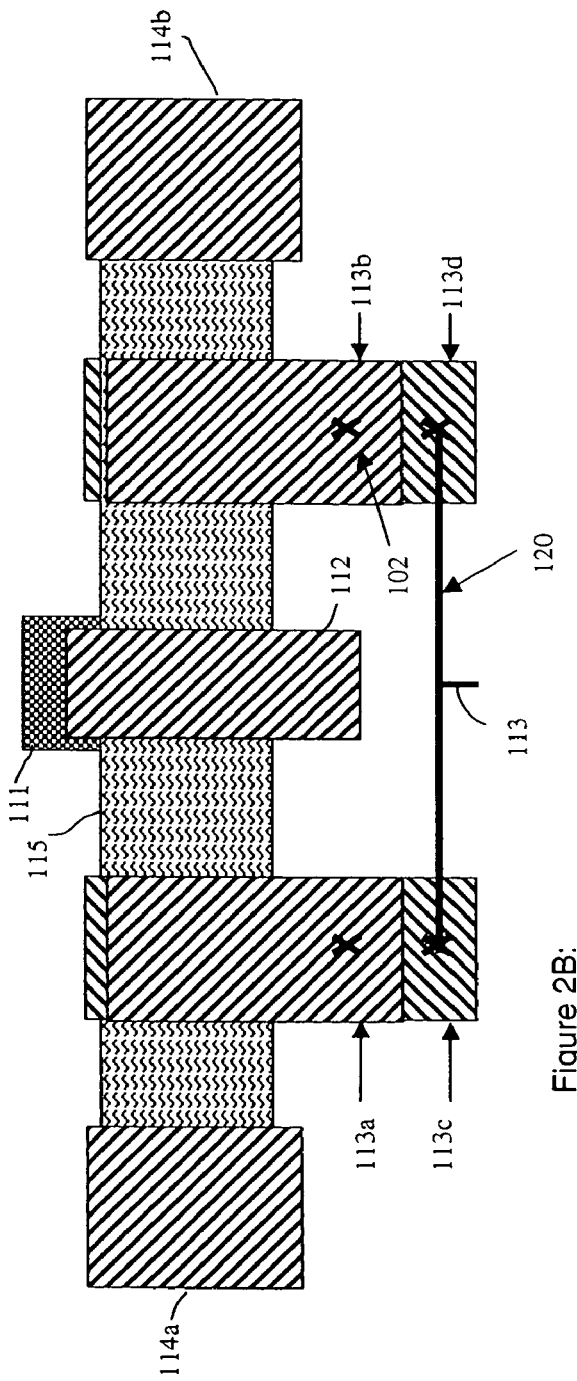
Figure 2A
Figure 2B:

RECEIVER CIRCUIT USING NANOTUBE-BASED SWITCHES AND LOGIC

CROSS-REFERENCE TO RELATED APPLICATIONS

This application claims priority under 35 U.S.C. § 119(e). to U.S. Provisional Pat. Apl. Ser. No. 60/581,075, filed on Jun. 18, 2004, entitled Non-Volatile Carbon Nanotube Logic (NLOGIC) Receiver Circuit, which is incorporated herein by reference in its entirety.

This application is related to the following references:

- U.S. patent application Ser. No. 10/917,794, filed on Aug. 13, 2004, entitled Nanotube-Based Switching Elements;
- U.S. patent application Ser. No. 10/918,085, filed on Aug. 13, 2004, entitled Nanotube-Based Switching Elements With Multiple Controls;
- U.S. patent application Ser. No. 10/918,181, filed on Aug. 13, 2004, entitled Nanotube Device Structure And Methods Of Fabrication;
- U.S. patent application Ser. No. 10/917,893, filed on Aug. 13, 2004, entitled Nanotube-Based Switching Elements And Logic Circuits;
- U.S. patent application Ser. No. 10/917,606, filed on Aug. 13, 2004, entitled Isolation Structure For Deflectable Nanotube Elements;
- U.S. patent application Ser. No. 10/917,932, filed on Aug. 13, 2004, entitled Circuits Made From Nanotube-Based Switching Elements With Multiple Controls;
- U.S. patent application Ser. No. not yet assigned, filed on date even herewith, entitled Nanotube-Based Transfer Devices and Related Circuits;
- U.S. patent application Ser. No. not yet assigned, filed on date even herewith, entitled Integrated Nanotube and Field Effect Switching Device;
- U.S. patent application Ser. No. not yet assigned, filed on date even herewith, entitled Receiver Circuit Using Nanotube-Based Switches and Transistors;
- U.S. patent application Ser. No. not yet assigned, filed on date even herewith, entitled Nanotube-based Logic Driver Circuits;
- U.S. patent application Ser. No. not yet assigned, filed on date even herewith, entitled Storage Elements Using Nanotube Switching Elements; and
- U.S. patent application Ser. No. not yet assigned, filed on date even herewith, entitled Tri-State Circuit Using Nanotube Switching Elements.

BACKGROUND

1. Technical Field

The present application generally relates to nanotube switching circuits and in particular to nanotube switching circuits used in receiver circuits.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or heavy radiation. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to heavy radiation because the radiation generates electrical currents inside the semiconductor material. It is possible to manufacture integrated circuits with special devices and isolation techniques so that they remain operational when exposed to heavy radiation, but the high cost of these devices limits their availability and practicality. In addition, radiation hardened digital circuits exhibit timing differences from their normal counterparts, requiring additional design verification to add radiation protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Resistance to radiation and the ability to function correctly at elevated temperatures also expand the applicability of digital logic. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 July, 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electromechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341,054, 10/341,130, 10/776,059, and 10/776,572, the contents of which are hereby incorporated by reference in their entireties).

SUMMARY

The invention provides receiver circuits using nanotube based switches and logic.

Under one aspect of the invention, a receiver circuit includes a differential input having a first and second input link, and a differential output having a first and second output link. First, second, third and fourth switching elements each have an input node, an output node, a nanotube channel element, and a control structure disposed in relation to the nanotube channel element to controllably form and unform an electrically conductive channel between said input node and said output node. The control structure of the first switching element is in electrical communication with the first input link, and the input node is in electrical communication with a low reference voltage. The output node is in electrical communication with the first output link. The control structure of the second switching element in electrical communication with the second input link, and the input node is in electrical communication with a low reference voltage, and the output node is in electrical communication with the second output link. The output node of the third switching element is in electrical communication with the first output link, and the control structure is in electrical communication with the second output link and the input node is in electrical communication a high reference voltage. The output node of the fourth switching element is in electrical communication with the second output link, and the control structure is in electrical communication with the first output link and the input node is in electrical communication a high reference voltage.

Under another aspect of the invention, the control structure of the first and second switching elements includes a control (set) electrode and a release electrode, and the first input link is coupled to the control (set) electrode of the first switching element and the release electrode of the second switching element. The second input link is coupled to the control (set) electrode of the second switching element and the release electrode of the first switching element.

Under another aspect of the invention, the control structure of the third and fourth switching elements includes a control (set) electrode and a release electrode, and the first output link is coupled to the control (set) electrode of the fourth switching element. The second output link is coupled to the control (set) electrode of the third switching element, and the release electrodes of the third and fourth switching elements are coupled to the high reference voltage.

BRIEF DESCRIPTION OF THE DRAWINGS

FIGS. 2A-D illustrate nanotube switches as used in certain embodiments of the invention;

FIGS. 3A-C depict the notation used to describe the nanotube switch and its states.

DETAILED DESCRIPTION

Preferred embodiments of the invention provide a receiver circuit that uses nanotube-based switches. Preferably, the circuits are dual-rail (differential). The receiver circuit can sense small voltage inputs and convert them to larger voltage swings.

Figure 1:
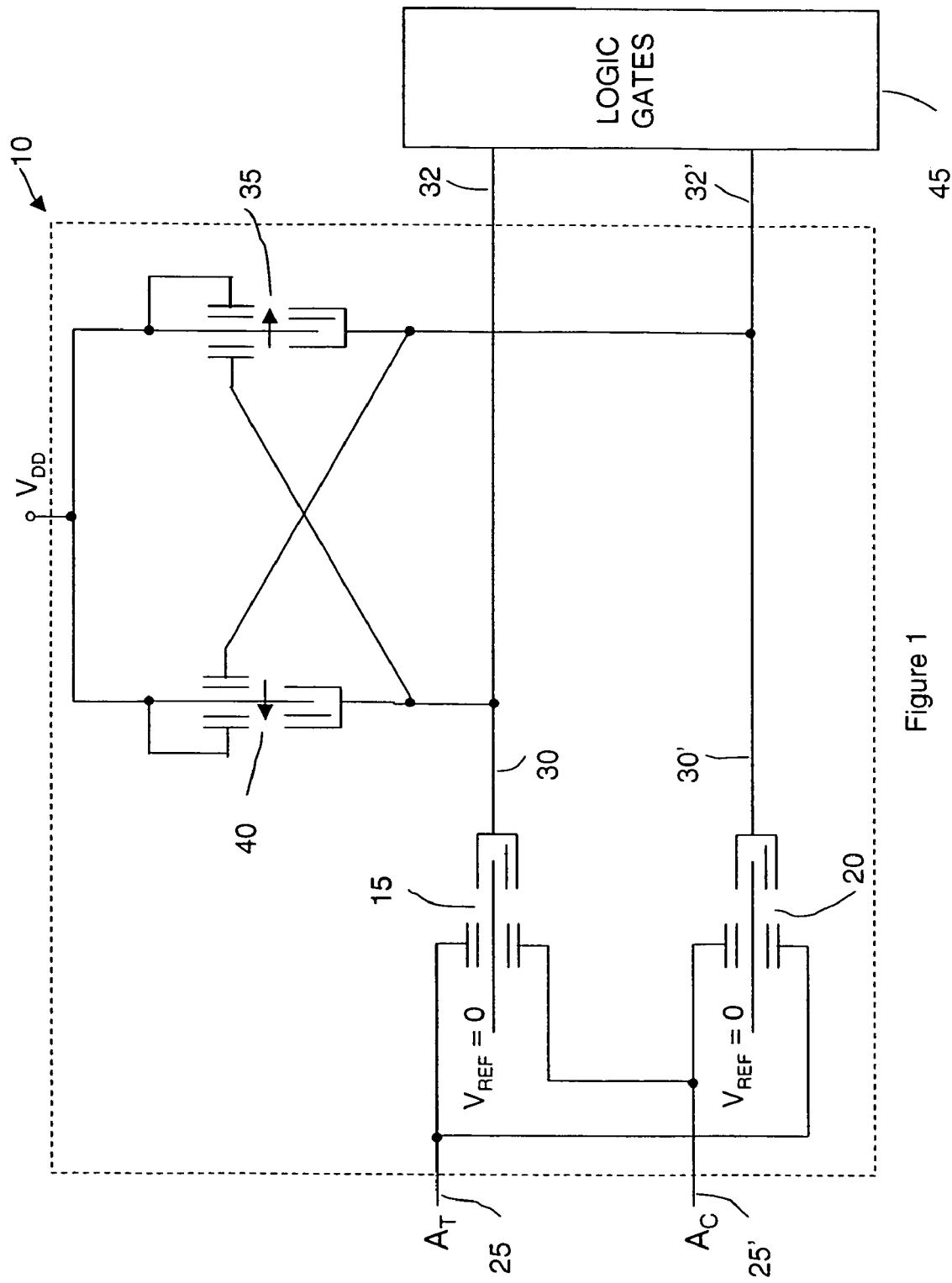
FIG. 1 depicts a receiver circuit according to certain embodiments of the invention.

FIG. 1 depicts a preferred receiver circuit 10. As illustrated the receiver circuit 10 receives differential input signal $A_T$ and $A_C$ on links 25 and 25' and provides a differential signal to other logic 45 via links 32 and 32'.

Receiver 10 includes non-volatile nanotube switches 15 and 20, and non-volatile nanotube switch pull-up devices 35 and 40. The outputs 30 and 30' of nanotube switches 15 and 20 are connected to the outputs of pull-up switches 35 and 40. $A_T$ is coupled to the control electrode (more below) of nanotube switch 15 and $A_C$ is coupled to the release electrode (more below). $A_C$ is coupled to the control electrode of nanotube switch 20 and $A_T$ is coupled to the release electrode. Each nanotube switch 15 and 20 has its signal electrode (more below) coupled to ground. The outputs 30 and 30' are cross-coupled to the control electrodes of the pull-up switches 35 and 40 as depicted. The release electrodes of each pull-up switch are tied to the nanotube channel element and signal electrode of the switch, as depicted. The signal electrode is tied to Vdd in this embodiment. The pull-up switches 35 and 40 are sized to be volatile devices.

FIGS. 2A-D depict a preferred nanotube switching element 100 in cross-section and layout views and in two informational states. These switches may be used for switches 15 and 20 of FIG. 1. A more detailed description of these switches may be found in the related cases identified and incorporated above. A brief description follows here for convenience.

FIG. 2A is a cross sectional view of a preferred nanotube switching element 100. Nanotube switching element includes a lower portion having an insulating layer 117, control electrode 111, output electrodes 113*c,d*. Nanotube switching element further includes an upper portion having release electrode 112, output electrodes 113*a,b*, and signal electrodes 114*a,b*. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Output electrodes 113*a,b* are made of conductive material and are separated from nanotube channel element 115 by insulating material 119.

Output electrodes 113*c,d* are likewise made of conductive material and are separated from nanotube channel element 115 by a gap height G103. Notice that the output electrodes 113*c,d* are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114*a,b* each contact the nanotube channel element 115 and can therefore supply whatever signal is on the signal electrode to the channel element 115. This signal may be a fixed reference signal (e.g., Vdd or Ground) or varying (e.g., a Boolean discrete value signal that can change). Only one of the electrodes 114*a,b* need be connected, but both may be used to reduce effective resistance.

Nanotube channel element 115 is a lithographically-defined article made from a porous fabric of nanotubes (more below). It is electrically connected to signal electrodes 114*a,b*. The electrodes 114*a,b* and support 116 pinch or hold the channel element 115 at either end, and it is suspended in the middle in spaced relation to the output electrodes 113*a-d* and the control electrode 111 and release electrode 112. The spaced relationship is defined by the gap heights G102-G104 identified above. For certain embodiments, the length of the suspended portion of channel element 115 is about 300 to 350 nm.

Under certain embodiments the gaps G103, G104, G102 are in the range of 5-30 nm. The dielectric on terminals 112, 111, and 113*a* and 113*b* are in the range of 5-30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

FIG. 2B is a plan view or layout of nanotube switching element 100. As shown in this figure, electrodes 113*b,d* are electrically connected as depicted by the notation 'X' and item 102. Likewise electrodes 113*a,c* are connected as depicted by the 'X'. In preferred embodiments the electrodes are further connected by connection 120. All of the output electrodes collectively form an output node 113 of the switching element 100.

Figure 2C:
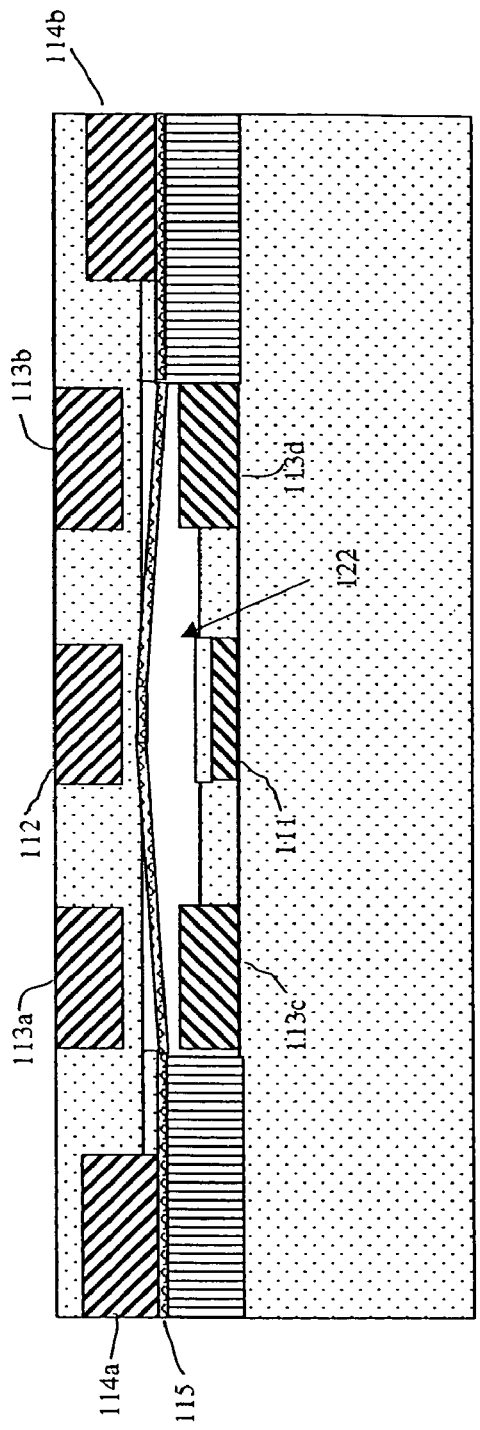

Under preferred embodiments, the nanotube switching element 100 of FIGS. 2A and 2B operates as shown in FIGS. 2C and D. Specifically, nanotube switching element 100 is in an OPEN (OFF) state when nanotube channel element is in position 122 of FIG. 1C. In such state, the channel element 115 is drawn into mechanical contact with dielectric layer 119 via electrostatic forces created by the potential difference between electrode 112 and channel element 115. Output electrodes 113*a,b* are in mechanical contact (but not electrical contact) with channel element 115. Nanotube switching element 100 is in a CLOSED (ON) state when channel element 115 is elongated to position 124 as illustrated in FIG. 1D. In such state, the channel element 115 is drawn into mechanical contact with dielectric layer 118 via electrostatic forces created by the potential difference between electrode 111 and channel element 115. Output electrodes 113*c,d* are in mechanical contact and electrical contact with channel element 115 at regions 126. Consequently, when channel element 115 is in position 124, signal electrodes 114*a* and 114*b* are electrically connected with output terminals 113*c,d* via channel element 115, and the signal on electrodes 114*a,b* may be transferred via the channel (including channel element 115) to the output electrodes 113*c,d*.

By properly tailoring the geometry of nanotube switching element 100, the nanotube switching element 100 may be made to behave as a non-volatile or a volatile switching element. By way of example, the device state of FIG. 2D may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

Figure 2D:
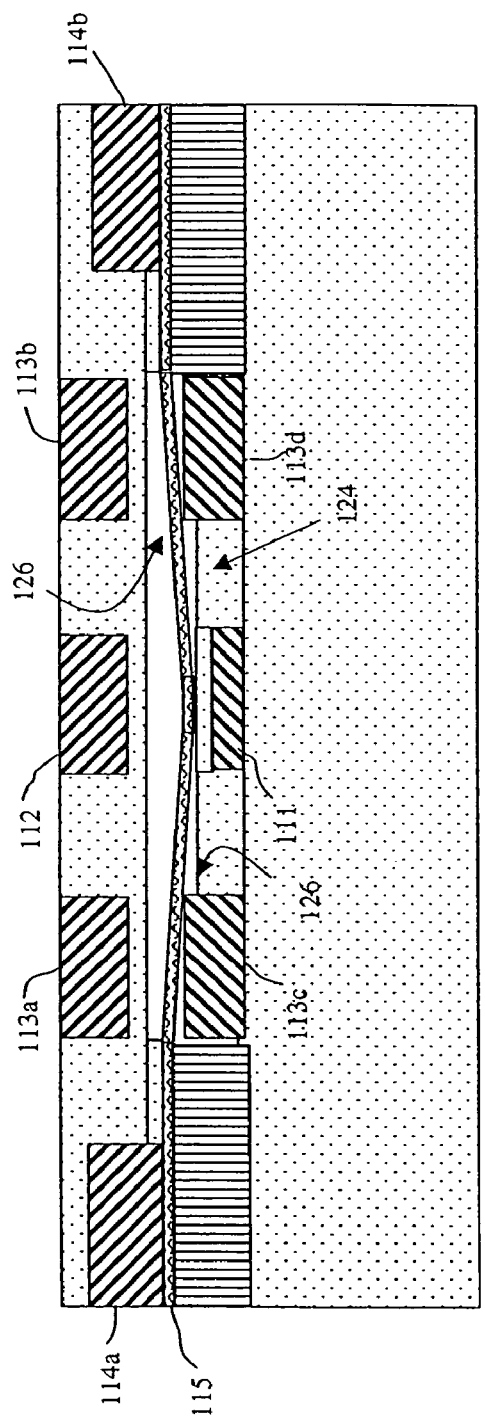

The nanotube switching element 100 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with electrode 111 (or 112). (This aspect of operation is described in the incorporated patent references.) This deflection is depicted in FIGS. 2D (and 2C). The attractive force streches and deflects the nanotube fabric of channel element 115 until it contacts the insulated region 118 of the electrode 111. The nanotube channel element is thereby strained, and there is a restoring tensil force, dependent on the geometrical relationship of the circuit, among other things.

By using appropriate geometries of components, the switching element 100 then attains the closed, conductive state of FIG. 1D in which the nanotube channel 115 mechanically contacts the control electrode 111 and also output electrode 113*c,d*. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113. Instead, the channel element 115 is attracted to and physically contacts the insulation layer on release electrode 112. This OPEN (OFF) state is shown in FIG. 2C. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 2A) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 1A. Instead, the electrodes 111 and 112 are expected to be operated so that the channel element 115 will either be in the state of FIG. 2C or 2D.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, an output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of the output node. In the preferred embodiment this problem is addressed with an output node that includes an isolation structure to prevent such disturbances from being caused.

Specifically, the nanotube channel element 115 is disposed between two oppositely disposed electrodes 113b,d (and also 113a,c) of equal potential. Consequently, there are equal but opposing electrostatic forces that result from the voltage on the output node. Because of the equal and opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

Under certain embodiments of the invention, the nanotube switching element 100 of FIG. 2A may be used as pull-up and pull-down devices to form power-efficient circuits. Unlike MOS and other forms of circuits, the pull-up and pull down devices may be identical devices and need not have different sizes or materials. To facilitate the description of such circuits and to avoid the complexity of the layout and physical diagrams of FIGS. 1A-D, a schematic representation has been developed to depict the switching elements.

FIG. 3A' is a schematic representation of a nanotube switching element 100 of FIG. 2A. The nodes use the same reference numerals. The nanotube switching element 100 may be designed to operate in the volatile or non-volatile switching mode. In this example, a non-volatile switching mode is used as illustrated by switches 15 and 20 in FIG. 1.

Figure 3B:
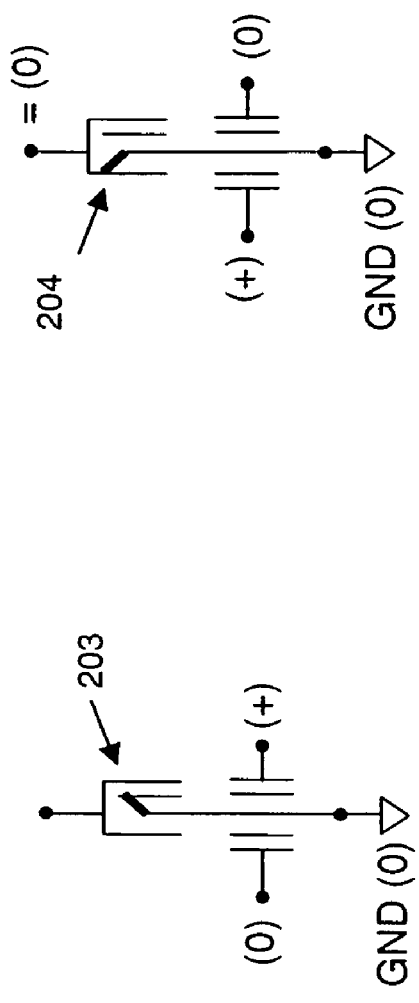
Figure 3C:
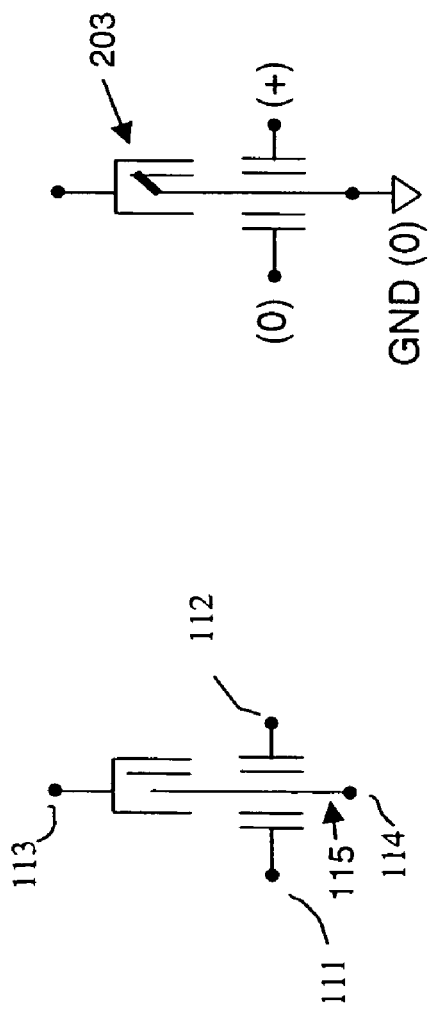
Figure 3B:
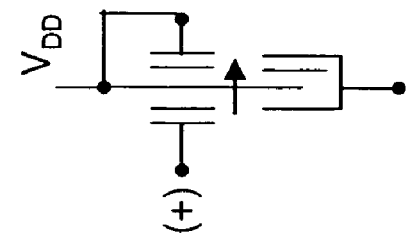
Figure 3C:
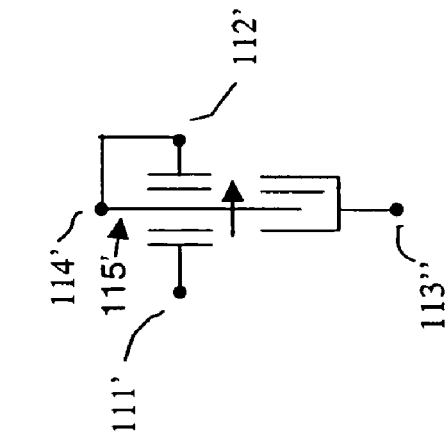

FIGS. 3B-C depict a nanotube channel element 100 when its signal electrodes is tied to ground, and its states of operation. For example, FIG. 3B is a schematic representation of the nanotube switching element in the OPEN (OFF) state illustrated in FIG. 2C, in which node 114 and the nanotube channel element 115 are at ground, the control electrode 111 is at ground, and the release electrode 112 is at Vdd. The nanotube channel element is not in electrical contact with output node 113, but instead is depicted by the short black line 203 representing the nanotube element contacting insulator 119. FIG. 3C is a schematic representation of the switching element in the CLOSED (ON) state illustrated in FIG. 2D. In this case, signal node 114 and the nanotube channel element 115 are at ground, the control electrode 111 is at Vdd, and the release electrode 112 is at ground. The nanotube channel element is deflected into mechanical and electrical contact with the output node 113. Moreover, if as described above, geometries are selected appropriately, the contact will be non-volatile as a result of the Van der Waals forces between the channel element and the uninsulated, output electrode.) The state of electrical contact is depicted by the short black line 204 representing the nanotube channel element contacting the output terminal 113. This results in the output node 113 assuming the same signal (i.e., Vdd) as the nanotube channel element 115 and signal node 114. The switches 15 and 20 operate analogously but opposite when the signal electrode is tied to Vdd.

FIG. 3A' is a schematic representation of a nanotube switching element 100 of FIG. 2A designed to be used in a volatile operating mode with release electrode connected to the nanotube switching element through the switching node contacting the nanotube element as illustrated by switches 35 and 40 in FIG. 1. The nodes use the same reference numerals plus a prime ('). Also, the release electrode is electrically connected to the nanotube contact such that there is no voltage difference between release electrode and the nanotube channel element. The arrow is used to show the mechanical force and direction on the nanotube channel element 115. For example, as depicted, the channel element has a bias away from electrode 111, i.e., if the channel element 115 were deflected into contact with electrode 111 a mechanical restoring force would be in the direction of the arrow.

FIGS. 3B'-C' depict a nanotube channel element 100 when its signal electrodes are tied to VDD, and its states of operation. For example, FIG. 3B' is a schematic representation of the nanotube switching element in the OPEN (OFF) state illustrated in FIG. 2C, in which node 114' and the nanotube channel element 115' are at VDD, the release electrode 112' is electrically connected to node 114' and is therefore also at VDD, and the control electrode 111' is also at VDD. The nanotube channel element is not in electrical contact with output node 113, but instead is in a non-extended position, restored by the mechanical restoring force indicated by the arrow in FIG. 2B'. FIG. 3C' is a schematic representation of the switching element in the CLOSED (ON) state illustrated in FIG. 2D. In this case, signal node 114' and the nanotube channel element 115' are at VDD, the release electrode 112' is electrically connected to signal node 114' and is therefore also at VDD, and the control electrode 111' is at ground. The nanotube channel element is deflected into mechanical and electrical contact with the output node 113. Moreover, if as described above, geometries are selected appropriately, the contact will be volatile and the channel element will remain in contact with the uninsulated output electrode until the electrostatic force is removed, and then the mechanical restoring force in the direction of the arrow will overcome the van der Waals forces and release nanotube channel element from contact with the output electrode. The state of the volatile electrical contact is depicted by the short black line 204' representing the nanotube channel element contacting the output terminal 113'. This results in the output node 113' assuming the same signal (i.e., Vdd) as the nanotube channel element 115' and signal node 114'. The switches 35 and 40 operate analogously but opposite when the signal electrode is tied to ground.

Receiver 10 is designed with non-volatile nanotube switches 15 and 20, and volatile nanotube switches 35 and 40. Non-volatile switches 15 and 20 are designed such that the mechanical restoring forces that result from the nanotube elongation after switching are weaker than the van der Waals restraining forces. An electrostatic voltage is used (required) to change the state of the nanotube from "ON" (CLOSED) to "OFF" (OPEN), and "OFF" to "ON." Volatile switches 35 and 40 have the release plate electrically connected to the nanotube contact so that there is no electrostatic restoring force. Volatile devices 35 and 40 are designed such that the mechanical restoring forces that result from the nanotube elongation after switching are stronger than the van der Waals restraining forces, and the volatile nanotube will return to from the "ON" state to the "OFF" state once the electrostatic field is removed (the difference voltage between the input electrode and the nanotube fabric goes to zero). The direction of the mechanical restoring force is indicated by an arrow in the symbol for volatile nanotube switches 35 and 40. The nanotube contact of each of the non-volatile switches 15 and 20 is connected to ground (reference voltage VREF=0).

Figure 4A:
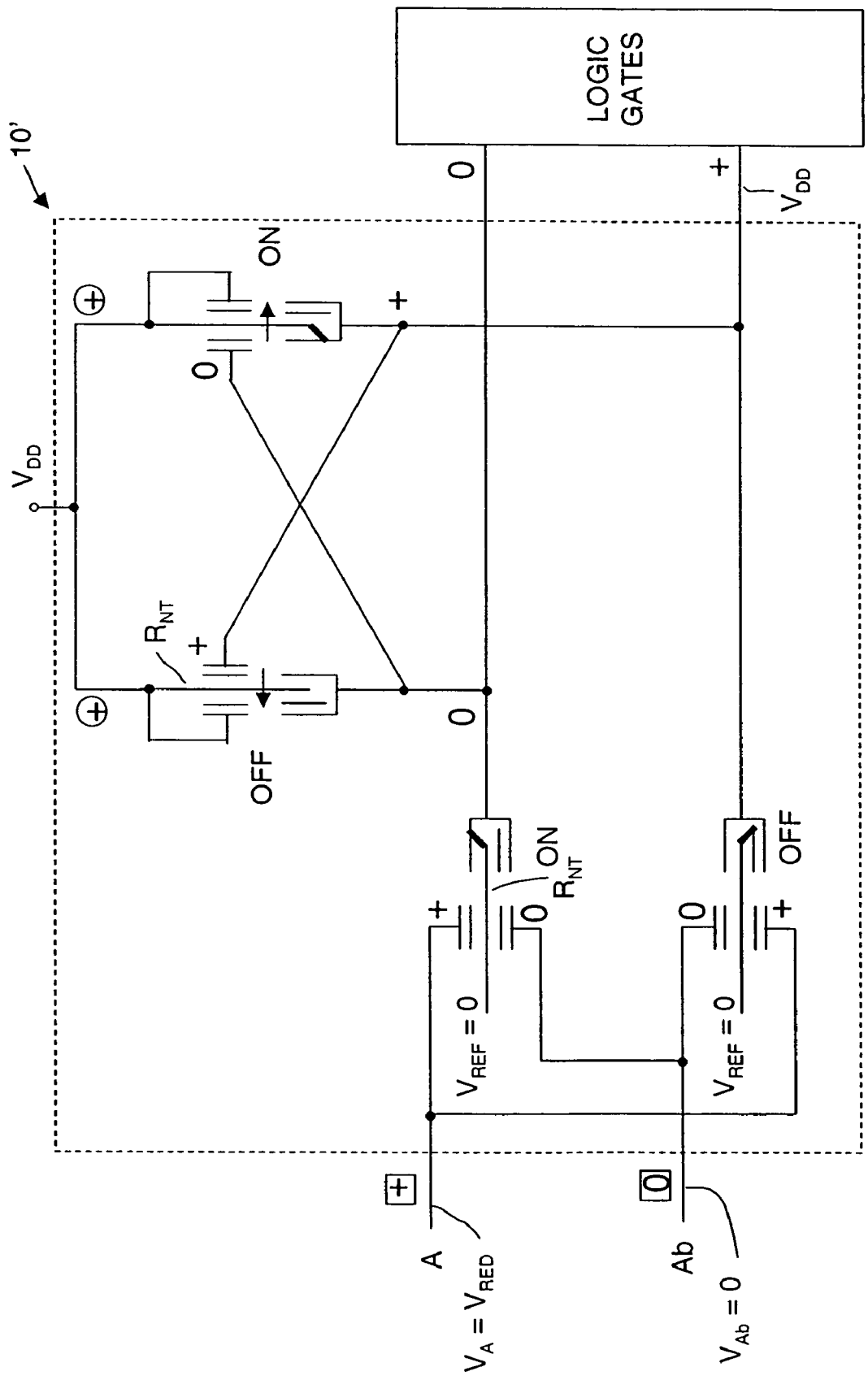
FIGS. 4A-B depict the operation of the receiver circuit shown in FIG. 1.

FIG. 4A illustrates the operation of receiver 10 shown in FIG. 1 when input voltage VAt=VRED, a positive voltage, and complementary voltage VAc=0. VRED is not necessarily the same as VDD, and may be lower than VDD, for example. The nanotube threshold voltage of nonvolatile nanotube switches 15 and 20 is set to activate the switches to the "ON" or "OFF" state in response to voltage VRED. That is, voltage difference of VRED or higher across the control node and nanotube channel element is sufficient to make the switch contact the output node and form a channel between the signal node and the output node. For the applied conditions illustrated in FIG. 4A, the voltage difference between the input gate and the nanotube channel element of nonvolatile nanotube switch 15 forces the nanotube channel element in contact with the output electrode and output 30 is thus connected to ground (i.e., the voltage on the signal electrode of switch 15). Also, the voltage difference between release gate and the nanotube channel element of nonvolatile nanotube switch 20 forces the nanotube channel element in contact with the dielectric layer on the opposing output electrode, and output 30' is in an open state. If volatile nanotube switch 40 is in the "ON" state at the time, a current will flow briefly from power supply VDD to ground through switches 40 and 15. The resistance RNT of the nanotube channel element is chosen such that the RNT of switch 15 is substantially lower than RNT of switch 40 so that output 30 is held near ground voltage. RNT for switch 15 is chosen to be 3 to 5 time smaller than RNT for switch 40. If switch 40 has a width of 10 parallel carbon nanotubes (NT fibers), then switch 15 is chosen to have a width of 30 to 50 parallel NT fibers, for example. When output 30 is forced to near zero volts, the input of switch 35 is forced to near zero volts and switch 35 turns "ON." The input voltage of switch 40 transitions from zero to VDD, reducing the voltage difference between switch 40 input electrode and nanotube element to zero. As the electrostatic force between input electrode and nanotube goes to zero, the mechanical restoring force turns switch 40 "OFF" and current stops through switches 40 and 15. Receiver 10 is in a state 10' illustrated in FIG. 4B. Logic gates 45 input 32 is at zero volts, and input 32' is at VDD. Output 30' is at VDD, but no current flows because switch 20 is in the "OFF" (OPEN) position (state).

Figure 4B:
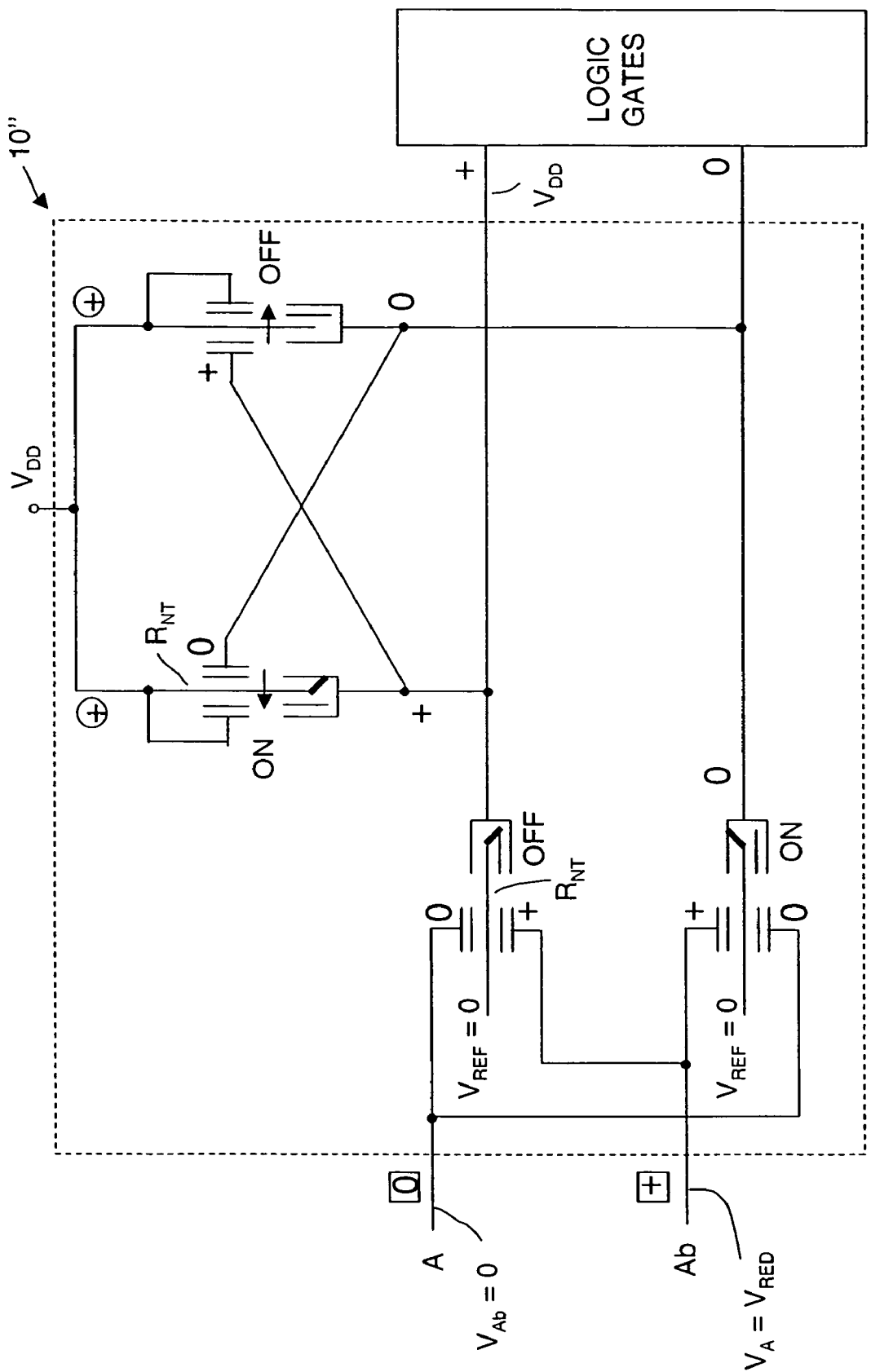

FIG. 4B illustrates the operation of receiver 10 shown in FIG. 1 when input voltage VAt equals zero, and complementary voltage VAc=VRED, a positive voltage. VRED is not necessarily the same as VDD, and may be lower than VDD, for example. The nanotube threshold voltage of nonvolatile nanotube switches 15 and 20 is set to activate the switches to the "ON" or "OFF" state in response to voltage VRED. For the applied conditions illustrated in FIG. 4B, the voltage difference between the input gate and the nanotube fabric of nonvolatile nanotube switch 20 forces the nanotube channel element in contact with the output electrode, and output 30' is connected to ground. Also, the voltage difference between release gate and the nanotube channel element of nonvolatile nanotube switch 15 forces the nanotube channel element in contact with the dielectric layer on the opposing electrode, and output 30 is in an open state. If volatile nanotube switch 35 is in the "ON" state at the time, a current will flow briefly from power supply VDD to ground through switches 35 and 20. Nanotube resistance RNT is chosen such that the RNT of switch 20 is substantially lower than RNT of switch 35 so that output 30' is held near ground voltage. RNT for switch 20 is chosen to be 3 to 5 time smaller than RNT for switch 35. If switch 35 has a width of 10 parallel NT fibers, then switch 20 is chosen to have a width of 30 to 50 parallel NT fibers, for example. When output 30' is forced to near zero volts, the input of switch 40 is forced to near zero volts and switch 40 turns "ON." The input voltage of switch 35 transitions from zero to VDD, reducing the voltage difference between switch 35 input electrode and nanotube element to zero. As the electrostatic force between input electrode and nanotube goes to zero, the mechanical restoring force turns switch 35 "OFF" and current stops through switches 40 and 15. Receiver 10 is in a state 10" illustrated in FIG. 4B. Logic gates 45 input 32 is at VDD volts, and input 32' is at zero. Output 30 is at VDD, but no current flows because switch 15 is in the "OFF" (OPEN) position (state).

Several of the incorporated, related patent references describe alternative variations of nanotube-based switches. Many of these may be incorporated into the embodiments described above, providing volatile or non-volatile behavior, among other things. Likewise the fabrication techniques taught in such cases may be utilized here as well.

Nanotube-based logic may be used in conjunction with and in the absence of diodes, resistors and transistors or as part of or a replacement to CMOS, biCMOS, bipolar and other transistor level technologies. Also, the non-volatile flip flop may be substitued for an SRAM flip flop to create a NRAM cell. The interconnect wiring used to interconnect the nanotube device terminals may be conventional wiring such as AlCu, W, or Cu wiring with appropriate insulating layers such as SiO2, polyimide, etc, or may be single or multi-wall nanotubes used for wiring.

There is no significant leakage current between input and output terminals in the "OFF" state of the nanotube-based switch, and there is no junction leakage. Therefore the nanotube-based switch may operate in harsh environments such as elevated temperatures, e.g., 150 to 200 deg-C. or higher. There is no alpha particle sensitivity.

While single walled carbon nanotubes are preferred, multi-walled carbon nanotubes may be used. Also nanotubes may be used in conjunction with nanowires. Nanowires as mentioned herein is meant to mean single nanowires, aggregates of non-woven nanowires, nanoclusters, nanowires entangled with nanotubes comprising a nanofabric, mattes of nanowires, etc. The invention relates to the generation of nanoscopic conductive elements used for any electronic application.

The following patent references refer to various techniques for creating nanotube fabric articles and switches and are assigned to the assignee of this application. Each is hereby incorporated by reference in their entirety:

- U.S. patent application Ser. No. 10/341,005, filed on Jan. 13, 2003, entitled Methods of Making Carbon Nanotube Films, Layers, Fabrics, Ribbons, Elements and Articles;
- U.S. patent application Ser. No. 09/915,093, filed on Jul. 25, 2001, entitled Electromechanical Memory Array Using Nanotube Ribbons and Method for Making Same;
- U.S. patent application Ser. No. 10/033,032, filed on Dec. 28, 2001, entitled Methods of Making Electromechanical Three-Trace Junction Devices;
- U.S. patent application Ser. No. 10/033,323, filed on Dec. 28, 2001, entitled Electromechanical Three-Trace Junction Devices;
- U.S. patent application Ser. No. 10/128,117, filed on Apr. 23, 2002, entitled Methods of NT Films and Articles;
- U.S. patent application Ser. No. 10/341,055, filed Jan. 13, 2003, entitled Methods of Using Thin Metal Layers to Make Carbon Nanotube Films, Layers, Fabrics, Ribbons, Elements and Articles;
- U.S. patent application Ser. No. 10/341,054, filed Jan. 13, 2003, entitled Methods of Using Pre-formed Nanotubes to Make Carbon Nanotube Films, Layers, Fabrics, Ribbons, Elements and Articles;
- U.S. patent application Ser. No. 10/341,130, filed Jan. 13, 2003, entitled Carbon Nanotube Films, Layers, Fabrics, Ribbons, Elements and Articles;
- U.S. patent application, Ser. No. 10/776,059, filed Feb. 11, 2004, entitled Devices Having Horizontally-Disposed Nanofabric Articles and Methods of Making The Same; and
- U.S. patent application, Ser. No. 10/776,572, filed Feb. 11, 2004, entitled Devices Having Vertically-Disposed Nanofabric Articles and Methods of Making the Same.

Volatile and non-volatile switches, and switching elements of numerous types of devices, can be thus created. In certain preferred embodiments, the articles include substantially a monolayer of carbon nanotubes. In certain embodiments the nanotubes are preferred to be single-walled carbon nanotubes. Such nanotubes can be tuned to have a resistance between 0.2-100 kOhm/□ or in some cases from 100 kOhm/□ to 1 GOhm/□.

The receiver circuit facilitates compatibility between carbon nanotube logic circuits and CMOS logic. For example, the output of conventional CMOS circuits may drive nanotube-based switches. Dual-rail (differential) logic inputs are used and the receiver circuit may operate in a differential sensing mode, at smaller voltage swings for high speed and lower power dissipation, with no internal logic reference level needed at the receiving end. The output of the receiver circuit is a voltage selected for desired (e.g., optimum) on chip circuit operation . Consequently, the receiver circuit may operate at a different voltage than CMOS logic circuits. Preferred receiver circuits enable a nanotube logic chip or an embedded nanotube logic function using only nanotube logic to interface directly with CMOS circuits driving the receiver inputs, with input voltage signals that may be different from on chip voltage signals. Also, preferred receiver circuits enables integrated logic blocks using CMOS and combined nanotube-based logic and CMOS technologies to operate at different power supply voltages in the same system on separate chips, or integrated on the same chip. Such a receiver, and other combined circuits, may be used to facilitate the introduction of nanotube-based logic in a CMOS environment.

The nanotube switching element of preferred embodiments utilizes multiple controls for the formation and unformation of the channel. In some embodiments, the device is sized to create a non-volatile device and one of the electrodes may be used to form a channel and the other may be used to unform a channel. The electrodes may be used as differential dual-rail inputs. Alternatively they may be set and used at different times. For example, the control electrode may be used in the form of a clock signal, or the release electrode may be used as a form of clocking signal. Also, the control electrode and release electrode may be placed at the same voltage, for example, such that the state of the nanotube cannot be disturbed by noise sources such as voltage spikes on adjacent wiring nodes.

A FIG. 2 device may be designed to operate as a volatile or non-volatile device. In the case of a volatile device, the mechanical restoring force due to nanotube elongation is stronger than the van der Waals retaining force, and the nanotube mechanical contact with a control or release electrode insulator is broken when the electrical field is removed. Typically, nanotube geometrical factors such as suspended length to gap ratios of less than 5 to 1 are used for volatile devices. In the case of a non-volatile device, the mechanical restoring force due to nanotube elongation is weaker than the van der Waals retaining force, and the nanotube mechanical contact with a control or release electrode insulator remains un-broken when the electric field is removed. Typically, nanotube geometrical factors such as suspended length to gap ratios of greater than 5 to 1 and less than 15 to 1 are used for non-volatile devices. An applied electrical field generating an electromechanical force is required to change the state of the nanotube device. Van der Waals forces between nanotubes and metals and insulators are a function of the material used in the fabrication nanotube switches. By way of example, these include insulators such as silicon dioxide and silicon nitride, metals such as tungsten, aluminum, copper, nickel, palladium, and semiconductors such as silicon. For the same surface area, forces will vary by less than 5% for some combinations of materials, or may exceed 2× for other combinations of materials, so that the volatile and non-volatile operation is determined by geometrical factors such as suspended length and gap dimensions and materials selected. It is, however, possible to design devices by choosing both geometrical size and materials that exhibit stronger or weaker van der Waals forces. By way of example, nanotube suspended length and gap height and fabric layer density, control electrode length, width, and dielectric layer thickness may be varied. Output electrode size and spacing to nanotube may be varied as well. Also, a layer specifically designed to increase van der Waals forces (not shown) may be added during the fabrication nanotube switching element 100 illustrated in FIG. 1. For example, a thin (5 to 10 nm, for example) layer of metal (not electrically connected), semiconductor (not electrically connected), or insulating material may be added (not shown) on the insulator layer associated with control electrode 111 or release electrode 112 that increases the van der Waals retaining force without substantial changes to device structure for better non-volatile operation. In this way, both geometrical sizing and material selection are used to optimize device operation, in this example to optimize non-volatile operation.

In a complementary circuit such as an inverter using two nanotube switching elements 100 with connected output terminals, there can be momentary current flow between power supply and ground in the inverter circuit as the inverter changes from one logic state to another logic state. In CMOS, this occurs when both PFET and NFET are momentarily ON, both conducting during logic state transition and is sometimes referred to as "shoot-through" current. In the case of electromechanical inverters, a momentary current may occur during change of logic state if the nanotube fabric of a first nanotube switch makes conductive contact with the first output structure before the nanotube fabric of a second nanotube switch releases conductive contact with the second output structure. If, however, the first nanotube switch breaks contact between the first nanotube fabric and the first output electrode before the second nanotube switch makes contact between the second nanotube fabric and the second output electrode, then a break-before-make inverter operation occurs and "shoot-through" current is minimized or eliminated. Electromechanical devices that favor break-before-make operation may be designed with different gap heights above and below the nanotube switching element, for example, such that forces exerted on the nanotube switching element by control and release electrodes are different; and/or travel distance for the nanotube switching element are different in one direction than another; and/or materials are selected (and/or added) to increase the van der Waals forces in one switching direction and weakening van der Waals forces in the opposite direction.

By way of example, nanotube switching element 100 illustrated in FIG. 1 may be designed such that gap G102 is substantially smaller (50% smaller, for example) than gap G104. Also, gap G103 is made bigger such that nanotube element 115 contact is delayed when switching. Also, dielectric thicknesses and dielectric constants may be different such that for the same applied voltage differences, the electric field between release electrode 112 and nanotube element 115 is stronger than the electric field between control electrode 111 and nanotube element 115, for example, to more quickly disconnect nanotube element 115 from output terminals 113c and 113d. Output electrodes 113c and 113d may be designed to have a small radius and therefore a smaller contact area in a region of contact with nanotube element 115 compared with the size (area) of contact between nanotube element 115 and the insulator on control terminal 111 to facilitate release of contact between nanotube element 115 and output electrodes 113c and 113d. The material used for electrodes 113c and 113d may be selected to have weaker van der Waals forces respect to nanotube element 115 than the van der Waals forces between nanotube element 115 and the insulator on release electrode 112, for example. These, and other approaches, may be used to design a nanotube switching element that favors make-before-break operation thus minimizing or eliminating "shoot-through" current as circuits such as inverters switch from one logic state to another.

The material used in the fabrication of the electrodes and contacts used in the nanotube switches is dependent upon the specific application, i.e. there is no specific metal necessary for the operation of the present invention.

Nanotubes can be functionalized with planar conjugated hydrocarbons such as pyrenes which may then aid in enhancing the internal adhesion between nanotubes within the ribbons. The surface of the nanotubes can be derivatized to create a more hydrophobic or hydrophilic environment to promote better adhesion of the nanotube fabric to the underlying electrode surface. Specifically, functionalization of a wafer/substrate surface involves "derivitizing" the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface may be derivitized prior to application of a nanotube fabric.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A receiver circuit, comprising:
a differential input having a first and second input link;
a differential output having a first and second output link;
first, second, third and fourth switching elements, each having an input node, an output node, a nanotube channel element, and a control structure disposed in relation to the nanotube channel element to controllably form and unform an electrically conductive channel between said input node and said output node;
the control structure of the first switching element in electrical communication with the first input link, the input node being in electrical communication with a low reference voltage, and the output node being in electrical communication with the first output link;
the control structure of the second switching element in electrical communication with the second input link, the input node being in electrical communication with a low reference voltage, and the output node being in electrical communication with the second output link;
the output node of the third switching element in electrical communication with the first output link, the control structure being in electrical communication with the second output link and the input node being in electrical communication a high reference voltage;
the output node of the fourth switching element in electrical communication with the second output link, the control structure being in electrical communication with the first output link and the input node being in electrical communication a high reference voltage.

2. The receiver circuit of claim 1 wherein the high reference voltage is Vdd and the low reference voltage is ground.

3. The receiver circuit of claim 1 wherein the control structure of the first and second switching elements includes a set electrode and a release electrode, and wherein the first input link is coupled to the set electrode of the first switching element and the release electrode of the second switching element, and wherein the second input link is coupled to the set electrode of the second switching element and the release electrode of the first switching element.

4. The receiver circuit of claim 3 wherein the control structure of the third and fourth switching elements includes a set electrode and a release electrode, and wherein the first output link is coupled to the set electrode of the fourth switching element; wherein the second output link is coupled to the set electrode of the third switching element, and the release electrodes of the third and fourth switching elements are coupled to the high reference voltage.

5. The receiver circuit of claim 1 wherein the first and second switching elements are sized to be non-volatile switches.

6. The receiver circuit of claim 1 wherein the third and fourth switching elements are sized to be volatile switches.

* * * * *